(12) United States Patent
Wang et al.

(10) Patent No.: US 10,665,321 B2
(45) Date of Patent: May 26, 2020

(54) METHOD FOR TESTING MRAM DEVICE AND TEST APPARATUS THEREOF

(71) Applicant: Taiwan Semiconductor Manufacturing Co., Ltd., Hsinchu (TW)

(72) Inventors: Chia-Yu Wang, Hsinchu County (TW); Ching-Huang Wang, Taoyuan County (TW); Chun-Jung Lin, HsinChu (TW); Tien-Wei Chiang, Taipei (TW); Meng-Chun Shih, Hsinchu (TW); Kuei-Hung Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/690,303

(22) Filed: Aug. 30, 2017

(65) Prior Publication Data

US 2019/0066820 A1 Feb. 28, 2019

(51) Int. Cl.
| | |
|---|---|
| G11C 29/00 | (2006.01) |
| G11C 29/56 | (2006.01) |
| G11C 29/50 | (2006.01) |
| G11C 11/16 | (2006.01) |
| H01L 27/22 | (2006.01) |
| G11C 29/44 | (2006.01) |
| G11C 29/04 | (2006.01) |
| G11C 29/10 | (2006.01) |

(52) U.S. Cl.
CPC ...... *G11C 29/56016* (2013.01); *G11C 11/161* (2013.01); *G11C 11/1655* (2013.01); *G11C 29/44* (2013.01); *G11C 29/50* (2013.01); *G11C 29/50016* (2013.01); *G11C 29/56004* (2013.01); *G11C 29/56012* (2013.01); *G11C 29/72* (2013.01); *G11C 29/835* (2013.01); *H01L 27/222* (2013.01); *G11C 11/1675* (2013.01); *G11C 29/10* (2013.01); *G11C 2029/0403* (2013.01); *G11C 2029/5002* (2013.01)

(58) Field of Classification Search
None
See application file for complete search history.

(56) References Cited

U.S. PATENT DOCUMENTS

| | | | | |
|---|---|---|---|---|
| 6,115,828 | A * | 9/2000 | Tsutsumi | G11C 29/84 365/200 |
| 2014/0070800 | A1* | 3/2014 | Cho | G11C 29/56016 324/228 |
| 2015/0260804 | A1* | 9/2015 | Kishi | G01R 33/1207 324/210 |
| 2017/0256706 | A1* | 9/2017 | Toko | H01L 43/10 |

* cited by examiner

*Primary Examiner* — Uyen Smet
(74) *Attorney, Agent, or Firm* — JCIPRNET

(57) ABSTRACT

The disclosure is related a method for testing a magnetic memory device and a test apparatus are provided. In some exemplary embodiments, the method includes at least the following steps. The magnetic memory device is initialized by applying a first magnetic field to force write a first data to the magnetic memory device. Then, a second magnetic field is applied to the magnetic memory device. Second data may be obtained from the magnetic memory device by performing a chip probing process. Accordingly, performance of the magnetic memory device may be determined based on the second data.

20 Claims, 5 Drawing Sheets

METHOD FOR TESTING MRAM DEVICE AND TEST APPARATUS THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Some semiconductor devices comprise memory devices that are used to store information. A recent development in semiconductor memory devices is magnetic random access memory (MRAM) devices recording "1" or "0" through a magnetic polarity of ferromagnetic layer. However, the magnetic polarity of the ferromagnetic layer may be effected by external magnetic field. For example, MRAM may be carried or position next to a source emitting magnetic field, which may cause data lost. Thus, at end of wafer processing, performance of the MRAM is checked during wafer acceptance test (WAT) as to ensure a proper operation of the MRAM.

One of the ways to test the data retention of the MRAM devices during the production phase is to utilize the thermal property of the ferromagnetic materials. Wafer having MRAM devices are placed into an oven and bake for a long period of time. Data stored in the MRAM devices are compared before and after the baking process as to identify reversal of magnetic polarity in some of the MRAM cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
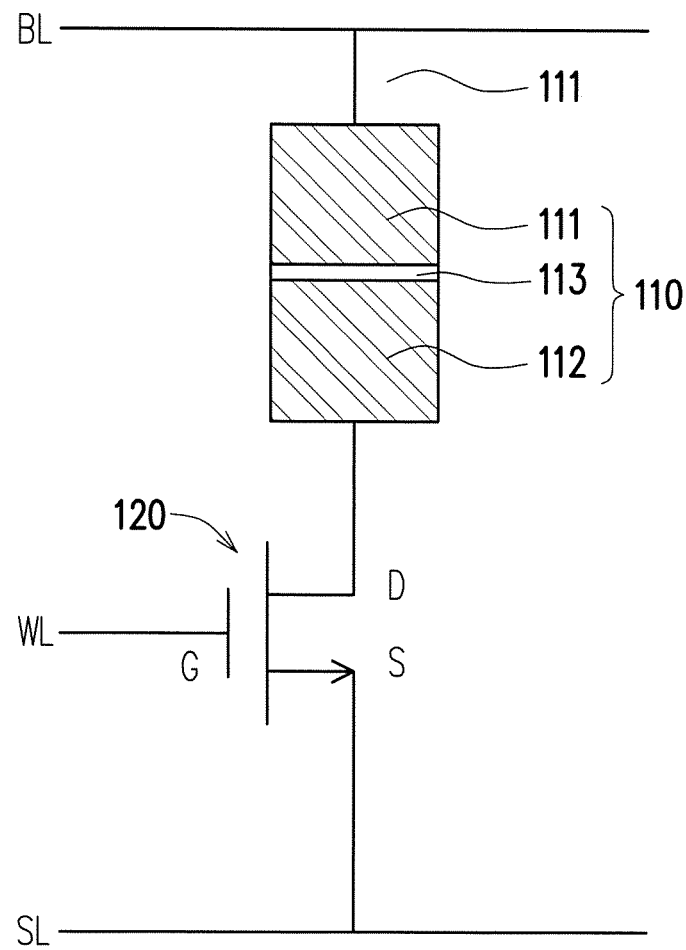
FIG. 1 is a circuit schematic illustrating a MRAM structure according to an exemplary embodiment of the present disclosure.

In the following, various exemplary embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include exemplary embodiments in which the first and second features are formed in direct contact, and may also include exemplary embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various exemplary embodiments and/or configurations discussed.

Exemplary embodiments of the present disclosure may comprise any one or more of the novel features described herein, including in the Detailed Description, and/or shown in the drawings. As used herein, "at least one," "one or more" and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more" and "at least one" can be used interchangeably herein.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

The exemplary embodiments of the disclosure are related a test apparatus and a method for testing magnetoresistive random access memory (MRAM). Novel test apparatus and method for testing MRAM would at least greatly reduces the amount of time for testing the performance of the MRAM during wafer acceptance test (WAT), and accurately determine whether the MRAM cells in a die is within a repair tolerance or not.

FIG. 1 is a circuit schematic illustrating a MRAM structure 100 according to an exemplary embodiment of the present disclosure. With reference to FIG. 1, the MRAM structure 100 includes an MRAM cell 110 and a transistor 110. The MRAM cell 110 may comprise a spin-transfer torque (STT) switched MRAM cell, for example. However, the disclosure is not intended to limit the type of the MRAM device, alternatively, the MRAM cell 110 may comprise other types of magnetic memory devices. For the STT switched MRAM cell, the spin of electrons is used to indicate the presence of a "1" or "0" as digital information. The MRAM cell 110 comprises conductive lines (word-lines and bit-lines) positioned in different directions, e.g., perpendicular to one another in different metal layers. The conductive lines sandwich resistive memory elements that comprise magnetic tunnel junctions (MTJs), which function as magnetic memory cells. MTJs include two ferromagnetic layers 111, 112 separated by a thin insulating tunneling barrier 113. One ferromagnetic layer is a fixed or pinned layer 112 and the other is a free layer 111 that changes resistive state by a change in magnetic polarity when programmed. Digital information stored in the MRAM cell 110 is read by detecting the MRAM cell's 110 resistive state.

The transistor 120 may comprise a complementary metal oxide semiconductor (CMOS) device or a bipolar junction transistor (BJT), as examples. In other exemplary embodiments, the transistor 114 may comprise other types of transistors. The transistor 114 may comprise a selection transistor coupled in series with the MRAM cell 110 in a uni-cell MRAM design, for example. The MRAM cell 110 is coupled at one end to the drain D of the transistor 114. The other end of the MRAM cell 110 is coupled to a bit-line BL of an MRAM array. The source S of the transistor 114 is coupled to a select-line SL of the MRAM array, and the gate G of the transistor 114 is coupled to a word-line WL of the MRAM array.

In some exemplary embodiments, the MRAM cell 110 may be coupled to the source S of the transistor 120, rather than the drain D (not shown). In these exemplary embodiments, the drain D of the transistor 120 is coupled to the select line SL, and the source S of the transistor 120 is coupled to the MRAM cell 110.

Figure 2:
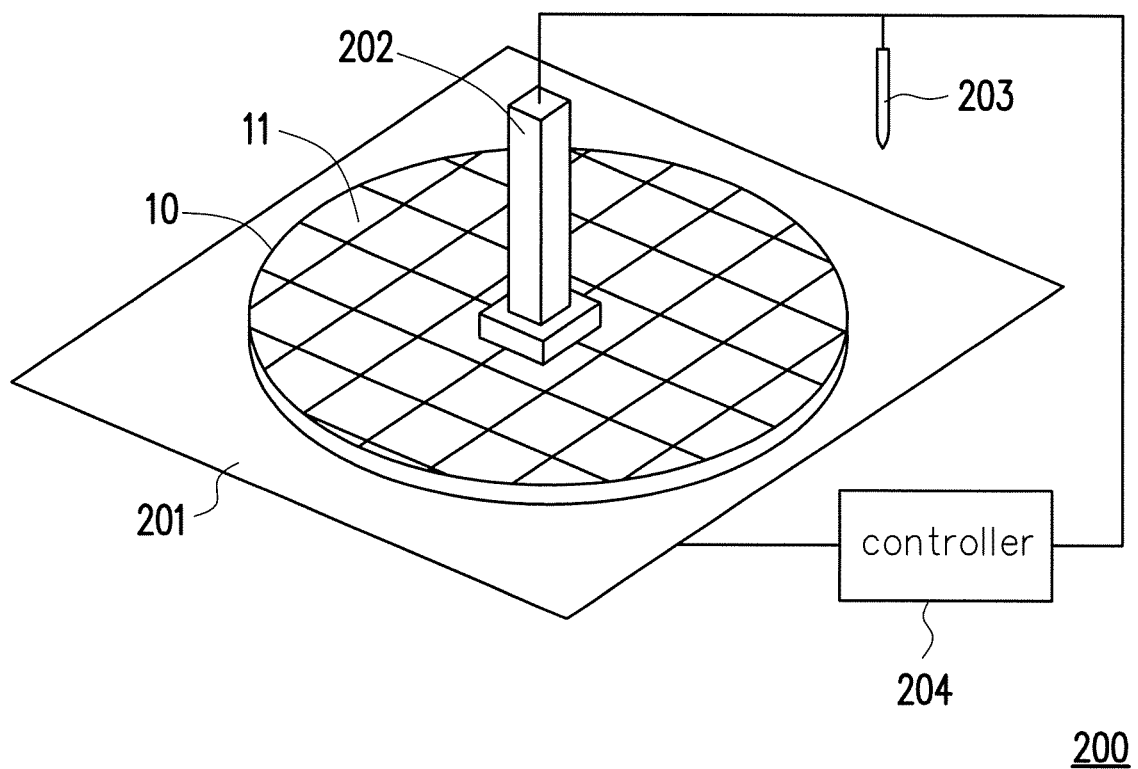
FIG. 2 is a diagram illustrating a test apparatus in accordance with an exemplary embodiment of the present disclosure.

FIG. 2 is a diagram illustrating a test apparatus 200 in accordance with an exemplary embodiment of the present disclosure. With reference FIG. 2, the test apparatus 200 includes a wafer fixture 201, a magnetic field generator 202, a probe 203, and a controller 204. The controller 204 is communicatively coupled to the wafer fixture 201, the magnetic field generator 202, and the probe 203, as to control or operate the wafer fixture 201, the magnetic field generator 202, and the probe 203. In FIG. 2, a wafer 10 including a plurality of dies or chips 11 are also illustrated. In some exemplary embodiments, the dies 11 include a plurality of MRAM structures 100 arranged in an array.

The wafer fixture 201 may include a plate holding the wafer 10. In the exemplary embodiment, the wafer fixture 201 is positioned below the magnetic field generator 202. In some exemplary embodiments, the wafer fixture 201 may further include driver (not shown), such as motor, actuator, and the like, that moves the plate in a direction (e.g., x, y and z directions) for positioning the wafer.

The magnetic field generator 202 may be an electromagnet that changing the magnetic field of the surroundings. The magnitude of the magnetic field may vary based on design requirements. This may be achieved by controlling the currents being supply to the electromagnet. In some exemplary embodiments, the magnetic field generator 202 may be enabled for a period of time for generating magnetic field pulse. In some exemplary embodiments, the magnetic field generator 202 may be configured to emit magnetic field pulse toward a particular direction. For example, a portion of the electromagnet may be covered with materials that shields the magnetic field which leaves unshielded portions of the electromagnet to isolate the magnetic field changes to an area in a particular direction.

The chip probe 203 is configured to contact test pads disposed on the wafer for measuring voltage, current, resistances, and other characteristics of the dies. The test pads may be disposed on the die 11 or scribe line between the dies 11.

The controller 204 is communicatively coupled to the wafer fixture 201, the magnetic field generator 202, and the probe 203 to control the operations thereof. In some exemplary embodiments, the controller 204 may include logic circuits (not shown) formed on an integrated circuit (IC chip) that are configured to control the wafer fixture 201, the magnetic field generator 202, and the probe 203. In some exemplary embodiments, the controller 204 include a processor (not shown), where the processor is programmed to perform the test on the MRAM cells disposed on the wafer in a wafer acceptance test (WAT). In the following, the WAT is described by using FIG. 3 with the components of the test apparatus described above.

Figure 3:
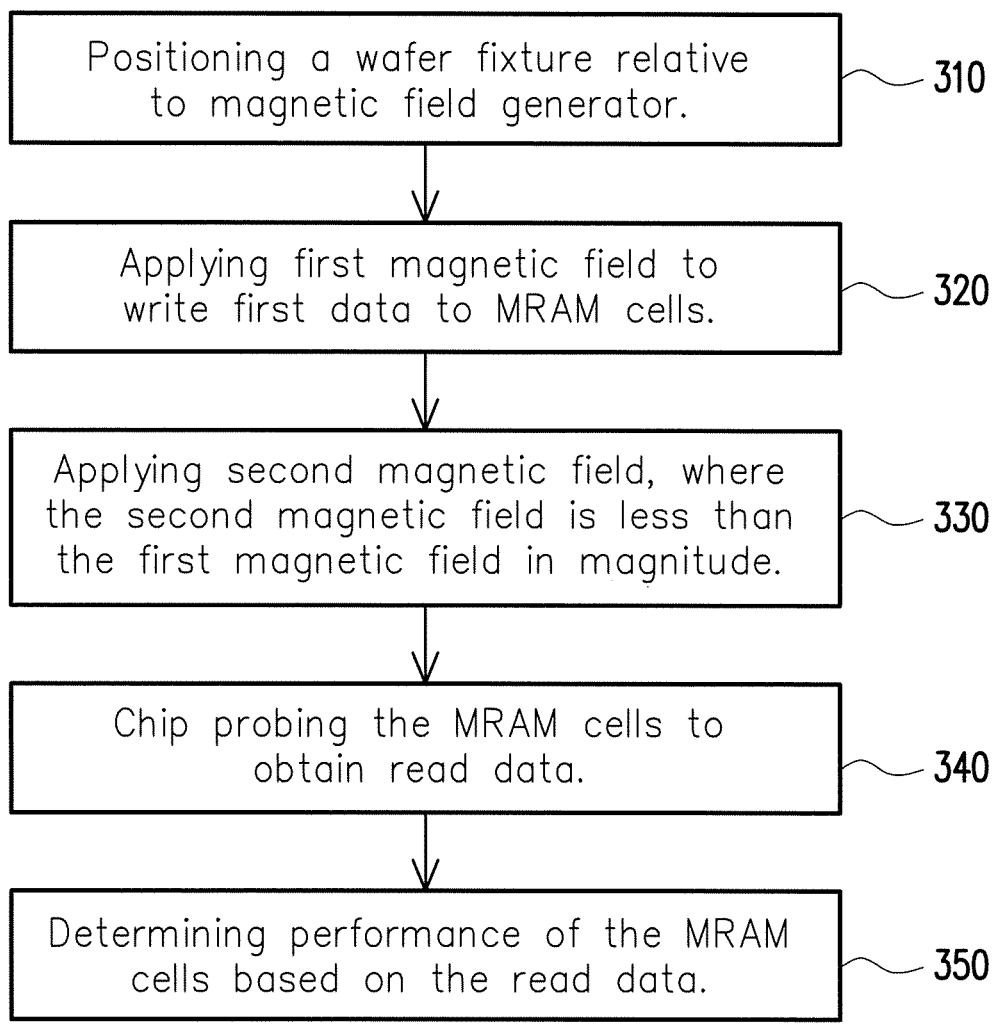
FIG. 3 is a flow diagram illustrating a test of MRAM cells disposed on a chip of a wafer in accordance to an exemplary embodiment of the present disclosure.

FIG. 3 is a flow diagram illustrating a test of MRAM cells disposed on a chip of a wafer in accordance to an exemplary embodiment of the present disclosure. In some exemplary embodiments, the controller may be configured to perform steps illustrated in the FIG. 3. The step may be performed in a sequence illustrated in the exemplary embodiments of FIG. 3. In some exemplary embodiments, the sequence of steps may be rearranged or additional steps may be inserted between steps based on the design requirements.

With reference to FIG. 3, after a wafer 10 including a plurality of MRAM cells arranged in an array is loaded to the test fixture 201, the test fixture 201 may be positioned relative to the magnetic field generator 202 (step S310). In some exemplary embodiments, the test fixture 201 may move to a location that is below the magnet field generator 202. In other exemplary embodiments, the positioning of the test fixture may be performed by the magnetic field generator 202, where the magnetic field generator 202 may be attached to motor which moves the magnetic field generator 202 to a location above the magnetic field generator.

Next, in step S320, the magnetic field generator 202 applies a first magnetic field to write first data to MRAM cells. In the exemplary embodiments, first magnetic field has a magnitude that is sufficient to forcibly change a magnetic polarity of the free layer of the MRAM cells. This step can be considered as part of initialization step that initializes the MRAM cells with a predetermined data pattern. For example, a test pattern of "1, 1, 1, 1, . . . " may be forcibly written to the MRAM cells subjected to the first magnetic field.

In step S330, the magnetic field generator 202 applies a second magnetic field to the MRAM cells disposed on the wafer 10. In the exemplary embodiments, a magnitude of the second magnetic field is smaller than a threshold magnitude determined to be a tolerance of the MRAM cells for which a magnetic polarity of the magnetoresistive element would be changed or reversed. In the disclosure, a magnetic field having the threshold magnitude would be referred to a reversal magnetic field. The magnitude of the reversal magnetic field may be predetermined depending at least on the material and design of the MRAM structure. The exemplary embodiments of the present disclosure are not intended to limit the range of the threshold magnitude.

In the exemplary embodiments, the magnitude of the second magnetic field is smaller than the magnitude of the first magnetic field. In other words, the magnitude of the first magnetic field is configured to be greater than the threshold magnitude of the reversal magnetic field to ensure that a test pattern is written to the MRAM by using the first magnetic field.

In step S340, a chip probing (processing) is performed to read data from the MRAM cells. In the exemplary embodiments, the probe 203 may be moved to a location that is in contact with the test pad disposed on the wafer 10, and the electrical parameters, such as voltage, current, resistance, and the like, may be measured therefrom.

In step S350, the controller 204 may determine performance of the MRAM cells based on the data read by the chip probing. In some exemplary embodiments, data retention or reliability of the MRAM cells against a magnetic field may be determined. In the exemplary embodiments, the second magnetic field is utilized to test the MRAM cells. Depending on the magnitude of the second magnetic field, one may determine the data retention capability of the subjected MRAM cells against the magnitude of the second magnetic field.

In some exemplary embodiments, the controller 204 may compare the read data (also referred to as second data) to an expected data, where the expected data is the test pattern (also referred to as first data) forcibly written to the MRAM cells by applying the first magnetic field in step 320.

In some exemplary embodiments, the controller 204 may forcibly write a test pattern having bit values of "1, 1, 1, 1, 1, 1, 1, 1 . . . " to the MRAM cells by changing the magnetic polarity of the MRAM cells through the first magnetic field. Then, it would be expected that each of the MRAM cells would have digital information of "1". The data retention capability may be tested by applying the second magnetic field. Thus, the read data is obtained after the second magnetic field has been applied to the MRAM cells. When the magnetic polarity of any one of the MRAM cells is affected (or reversed) by the second magnetic field, the bit value of a bit in the read data would be "0". Accordingly, the bit having bit value of "0" in the read data may be identified as a fail bit. In the exemplary embodiments, a MRAM cell stores a bit of data and is mapped to an address of the bit. For example, the read data may contain bit values of "1, 1, 1, 1, 0, 1, 1, 0". The comparison between the read and expected data shows that the 4th and 7th bits are does not match, which indicates that the magnetic polarity of the corresponding MRAM cells is reversed in response to the second magnetic field.

In the exemplary embodiment, the controller 204 identifies at least one fail bit(s) and its corresponding MRAM cell(s) by comparing the bit values of the read data to the expected data.

Then, the controller 204 determines whether the number of fail bits is within a repair tolerance. In the exemplary embodiments, the repair tolerance may refer to whether the MRAM device contains sufficient redundancy MRAM cells to replace fail MRAM cells corresponding to the fail bits. The redundancy MRAM cells may refer to additional cells that are not mapped to an address for normal operation of the MRAM cells, such as read and write operation. Instead, the redundancy MRAM cells are designated to be spare cells utilized for replacing bad cells.

In the exemplary embodiments, the controller 204 checks whether the number of fail bits is within the repair tolerance by comparing the number of fail bits to a first threshold. In the exemplary embodiment, the first threshold may be predefined or picked by a designer. For example, it may be acceptable to use 1% or any percentage of the redundancy MRAM cells to repair these fail bits during the WAT stage. The exemplary embodiments of the present disclosure are not intended to limit the first threshold. In some exemplary embodiments, the first threshold may be configured to be the number of the redundancy MRAM cells.

The controller 204 determines that the number of fail bits is within the repair tolerance when the number of fail bits is less than the first threshold. The controller 204 would repair the fail bit(s) by replacing the fail MRAM cell(s) corresponding to the fail bit(s) with the redundancy MRAM cell(s). In addition, an address of the MRAM cell(s) corresponding to the at least one fail bit(s) would be reconfigured to associate with the redundancy MRAM cell(s), and the fail MRAM cell(s) may be identified as a bad cell.

On the other hand, the controller 204 determines that the number of fail bits is not within the repair tolerance when the number of fail bits is greater than the first threshold. Then, all of the MRAM cells that was subjected to the test may be labeled as unrepairable and a die corresponding to the MRAM cells may be scrape later after dicing operation.

In some exemplary embodiments, the magnetic field generator 202 may move from die to die disposed on a wafer. A surface of the magnetic field generator 202 that emits the first and second magnetic fields may have a dimension similar to a dimension of a die. In other words, the first and second, magnetic fields may only be sufficient to test a portion of the wafer, and in the case of this exemplary embodiment, one die is tested by one magnetic field generator 202. In the exemplary embodiments, the steps 320 thru 350 may be performed for each and every dies on the wafer. With this configuration, all of the MRAM cells within each die are tested at the same time. If the number of MRAM cells excesses the repair tolerance, the corresponding die may be identified as bad die and scrap during the dicing operation.

The exemplary embodiments of the present disclosure are not intended to limit the dimension or the number of the magnetic field generators. In other exemplary embodiments, a magnetic field generator may be utilized to test a plurality of dies or the complete wafer at once, or multiple magnetic field generator may be implemented in the test apparatus to individually test multiple dies at once.

Based on the above, as compared to baking process, time spent on testing the MRAM device may be greatly reduced by applying magnetic field as to directly disrupt the magnetic polarity of the free layer. Furthermore, decisions of scraping or repairing the dies on a wafer may be accurately decided.

In the following, methods of performing a test on the MRAM device as to determine the performance of the MRAM device are described.

Figure 4:
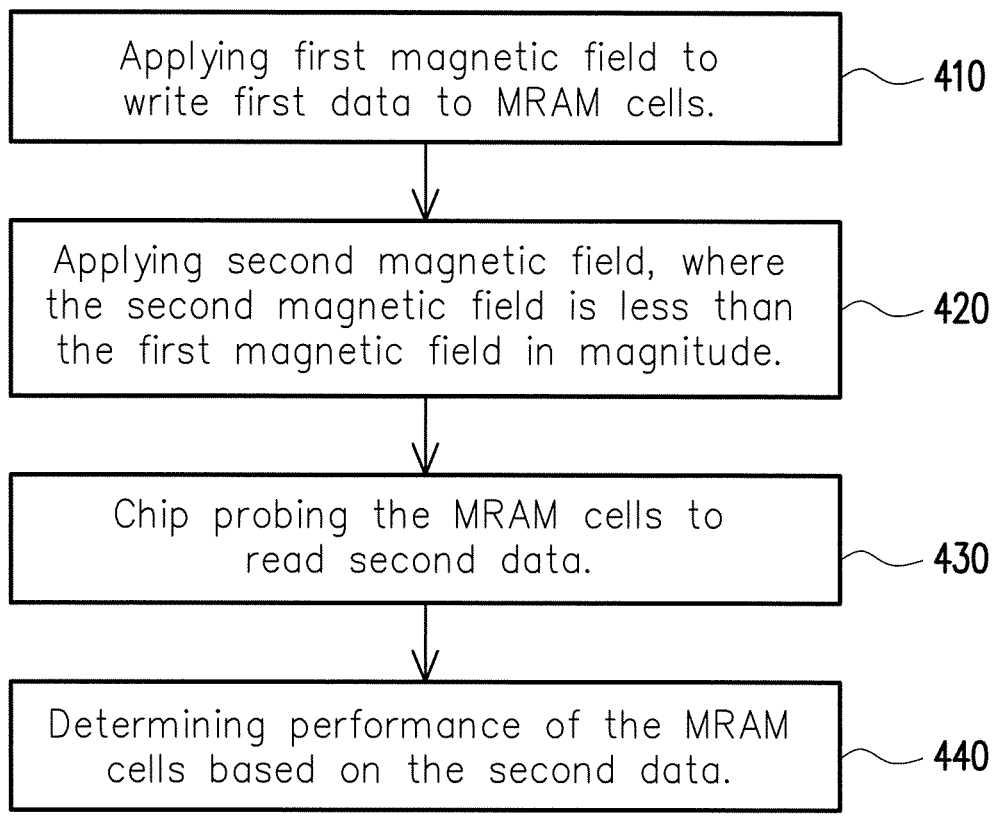
FIG. 4 is a flow diagram illustrating a test of MRAM cells disposed on a chip of a wafer in accordance to an exemplary embodiment of the present disclosure.

FIG. 4 is a flow diagram illustrating a test of MRAM cells disposed on a chip of a wafer in accordance to an exemplary embodiment of the present disclosure.

In step S410, a first magnetic field is applied to write a first data to MRAM cells. This step can be considered as an initialization step that initialize the magnetic polarity of the MRAM cells by using the first magnetic field.

In step S420, a second magnetic field is applied to the MRAM cells, wherein the second magnetic field is less than the first magnetic field in magnitude. The second magnetic field is less than the threshold magnetic field that has a polarity reversal magnitude that reverses the magnetic polarity of the tested MRAM cells.

In step S430, chip probing processing is performed on the MRAM cells to read a second data.

In step S440, the performance of the MRAM cells is determined based on the second data by identifying the number of fail bit(s).

It should be noted that the exemplary embodiment illustrated in FIG. 4 is not intended to limit the sequence of each steps. In other exemplary embodiments, the sequence of the steps may be changed according to the design requirement.

Figure 5:
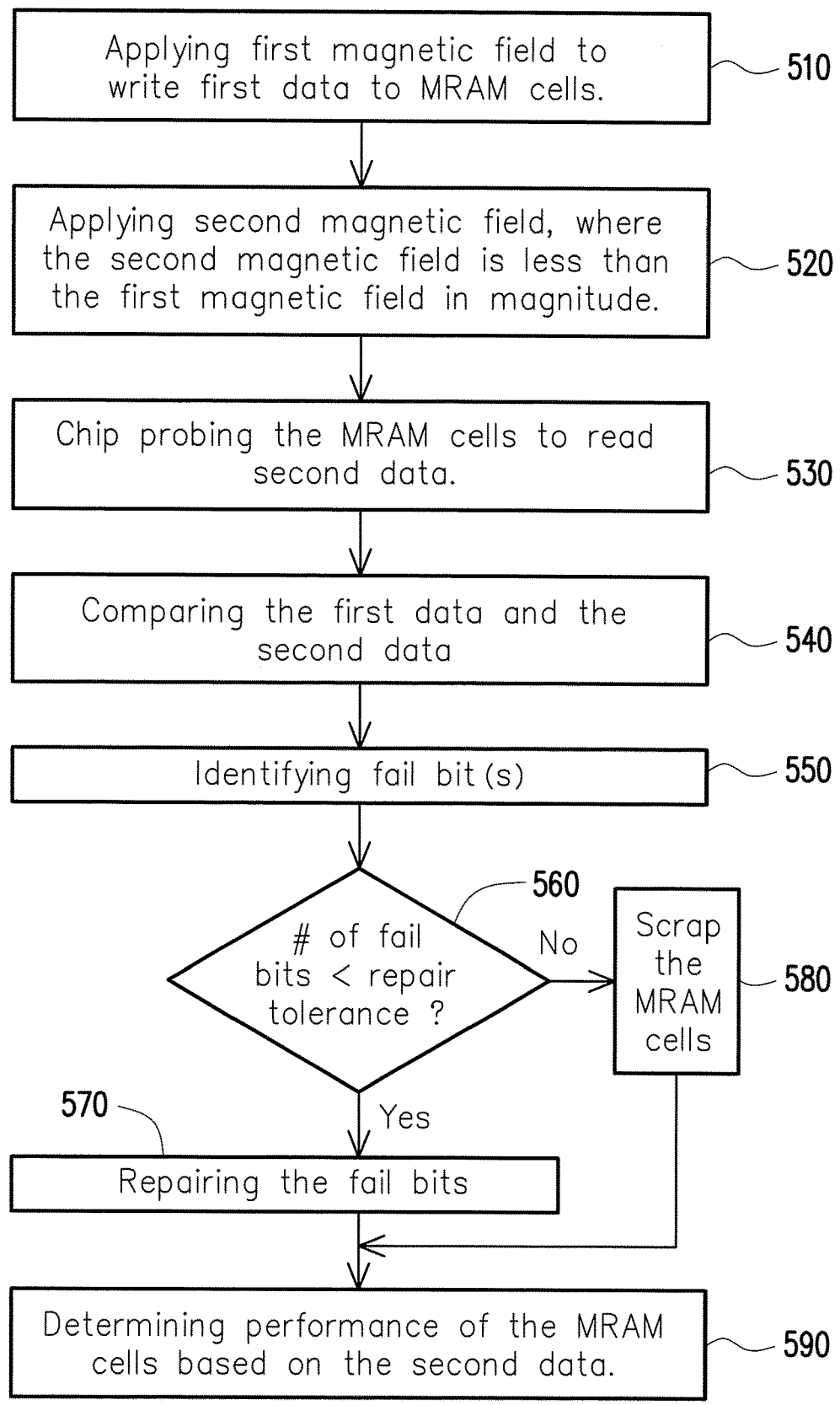
FIG. 5 is a flow diagram illustrating a test of MRAM cells disposed on a chip of a wafer in accordance to an exemplary embodiment of the present disclosure.

FIG. 5 is a flow diagram illustrating a test of MRAM cells disposed on a chip of a wafer in accordance to an exemplary embodiment of the present disclosure.

In step S510, a first magnetic field is applied to write a first data to MRAM cells.

In step S520, a second magnetic field is applied, wherein the second magnetic field is less than the first magnetic field in magnitude.

In step S530, chip probing processing is performed on the MRAM cells to read a second data.

In step S540, the first data and the second data are compared.

In step S550, at least one bit(s) having unmatched bit value between the first and second data is identified as fail bit(s).

In step S560, it is determined that whether the number of fail bits is less than repair tolerance.

In step S570, the fail bits are repaired when it is determined that the number of fail bits is less than the repair tolerance.

In step S580, the MRAM cells are identified as scrap when it is determined that the number of fail bits is greater than the repair tolerance.

In step S590, the performance of the MRAM cells is determined based on the first and second data.

It should be noted that the exemplary embodiment illustrated in FIG. 4 is not intended to limit the sequence of each steps. In other exemplary embodiments, the sequence of the steps may be changed according to the design requirement.

Based on the above, as compared to baking process, time spent on testing the MRAM device may be greatly reduced by applying magnetic field as to directly disrupt the magnetic polarity of the free layer. Furthermore, decisions of scraping or repairing the dies on a wafer may be accurately decided.

According to some exemplary embodiments, a method of testing a magnetic memory device is provided. The method includes at least the following steps: initializing the magnetic memory device by applying a first magnetic field to force write a first data to the magnetic memory device; applying a second magnetic field to the magnetic memory device; performing a chip probing process to read a second data from the magnetic memory device; and determining performance of the magnetic memory device based on the second data.

According to some exemplary embodiments, a method of performing a wafer acceptance test (WAT) on a wafer is provided. The wafer comprises magnetoresistive random access memory (MRAM) cells arranged in an array, and each MRAM cell includes a free layer having a magnetic polarity representing a data bit. The exemplary method includes at least the following steps: positioning a fixture holding the wafer below a magnetic field generator; generating a first magnetic field to change a magnetic polarity of the free layer of the MRAM cells positioned below the magnetic field generator; generating a second magnetic field; performing chip probing process on the MRAM cells to obtain a read data; and determining performance of the MRAM cells based on the read data.

According to some exemplary embodiments, a test apparatus is provided. The exemplary test apparatus includes a wafer fixture, a magnetic field generator, a probe, and a controller. The test apparatus is configured to hold a wafer having a plurality of MRAM cells arranged in an array. The controller is coupled to the magnetic field generator and the wafer fixture, and configured to execute the following instructions: positioning the wafer fixture relative to the magnetic field generator; applying a first magnetic field to initialize a magnetic polarity of the MRAM cells; applying a second magnetic field; performing a probing process to read a read data based on the magnetic polarity of the MRAM cells; and determining performance of the MRAM cells based on the read data.

The foregoing outlines features of several exemplary embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the exemplary embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of testing a magnetic memory device, comprising:
   positioning a magnetic field generator above a first die area of a wafer on which the magnetic memory device is disposed;
   initializing the magnetic memory device by applying a first magnetic field to force write a first data to the first die area comprising the magnetic memory device on the wafer;
   applying a second magnetic field to the first die area, wherein the first and second magnetic field are different in magnitude;
   moving a probe to contact a test pad of the first die area on the wafer for performing a chip probing process to read a second data from the magnetic memory device after the application of the first and second magnetic field; and
   determining performance of the magnetic memory device disposed on the first die by comparing the first data written to the magnetic memory device via the first magnetic field and the second data read from the magnetic memory device via the probe.

2. The method of claim 1, wherein after the first data is read, the method further comprises:
   identifying at least one fail bit(s) having unmatched data between the first and second data;
   determining whether the fail bit of the magnetic memory device is within a repair tolerance based on the number of fail bits;
   identifying the magnetic memory device as a scrap when determined that the magnetic memory device excesses the repair tolerance; and
   repairing the at least one fail bit(s) when determined that the magnetic memory device is within the repair tolerance.

3. The method of claim 2, wherein the step of determining whether the fail bit of the magnetic memory device is within a repair tolerance comprises:
   comparing the number of fail bits to a first threshold; and
   determining that the magnetic memory device is within the repair tolerance when the number of fail bits is less than the first threshold.

4. The method of claim 3, wherein the step of determining whether the fail bit of the magnetic memory device is within a repair tolerance comprises:
   determining the magnetic memory device is not within the repair tolerance when the number of fail bits is greater than the first threshold.

5. The method of claim 3, wherein the first threshold is the number of redundancy memory cells included in the magnetic memory device.

6. The method of claim 2, wherein the step of repairing the at least one fail bit(s) comprises:
   replacing a memory cell corresponding to the at least one fail bit(s) with a redundancy memory cell having a pass bit; and
   reconfiguring an address of the memory cell corresponding to the at least one fail bit(s) to the redundancy memory cell.

7. The method of claim 1, wherein the magnetic memory device is a portion of a wafer mounted on a wafer test fixture, further comprising:
 moving the wafer test fixture to position a second die area of the wafer under the magnetic field generator to test another magnetic memory device disposed thereon.

8. The method of claim 1, wherein the first and second magnetic fields are directional magnetic pulses, wherein a magnitude of the first magnetic field is greater than a magnitude of the second magnetic field and a magnitude of a reversal magnetic field, and the magnitude of the reversal magnetic field is greater than the magnitude of the second magnetic field.

9. The method of claim 1, wherein a magnitude of the second magnetic field is less than a magnitude of the first magnetic field.

10. The method of claim 1, wherein the second magnetic field has a magnitude less than a reversal magnitude reversing a magnetic polarity of a free layer of the magnetic memory device.

11. The method of claim 1, wherein the first magnetic field has a magnitude that changes a magnetic polarity of a free layer of the magnetic memory device.

12. A method of performing a wafer acceptance test (WAT) on a wafer, wherein the wafer comprises magnetoresistive random access memory (MRAM) cells arranged in an array, and each MRAM cell comprises a free layer having a magnetic polarity representing a data bit, comprising:
 positioning a die area of the wafer below a magnetic field generator by moving a fixture holding the wafer;
 generating a first magnetic field to change a magnetic polarity of the free layer of the MRAM cells positioned below the magnetic field generator;
 generating a second magnetic field different from the first magnetic field;
 performing chip probing process on the MRAM cells to obtain a read data by using a probe contacting a test pad disposed on a scribe line of the die area; and
 comparing the read data to an expected data;
 identifying a defect MRAM cell having unmatched data between the read and expected data; and
 replacing the defect MRAM cell with a redundancy MRAM cell when the number of the defect MRAM cells is within a predetermined percentage of redundancy MRAM cells; and
 determining the die area of the wafer as a bad die area when the number of the defect MRAM cells exceeds the predetermined percentage of the redundancy MRAM cells.

13. The method of claim 12, further comprising:
 performing a dicing process on the wafer to separate each die area on the wafer after the WAT is completed on every die area; and
 scrapping the bad die area after the dicing process.

14. The method of claim 12, wherein the first and second magnetic fields are directional electromagnetic pulses.

15. The method of claim 12, wherein a magnitude of the second magnetic field is less than a magnitude of the first magnetic field.

16. The method of claim 12, wherein the second magnetic field has a magnitude less than a threshold magnetic field which affects a magnetic polarity of the free layer of the MRAM cell.

17. The method of claim 12, further comprising:
 moving the fixture to position other die area of the wafer below the magnetic field generator to perform the WAT on the other die area of the wafer.

18. A test apparatus, comprising:
 a wafer fixture, holding a wafer having a plurality of dies, each of the dies including a plurality of MRAM cells arranged in an array;
 a magnetic field generator having a magnetic field application surface that has an area equal to an die area of one die;
 a probe; and
 a controller, coupled to the magnetic field generator and the wafer fixture, and configured to perform a wafer acceptance test (WAT) on all of the dies disposed on the wafer, wherein the WAT comprising:
  positioning one of the dies under the magnetic field generator at once;
  applying a first magnetic field to initialize a magnetic polarity of the MRAM cells to write an expected data into the MRAM cells;
  applying a second magnetic field different from the first magnetic field;
  performing a probing process to read a read data by reading voltage or current from a test pad disposed on a scribe line of the die; and
  determining at least one defect MRAM cell(s) by comparing the read data to the expected data.

19. The test apparatus of claim 18, wherein the the WAT further comprises:
 replacing the at least one defect MRAM cell(s) with a redundancy MRAM cell;
 determining the die as a bad die when the number of the at least one defect MRAM cells exceeds a predetermined number of redundancy MRAM cells disposed on the die; and
 after the WAT, the controller is further configured to perform a dicing operation to separate each die, wherein the controller is configured to scrape the bad die after the dicing operation.

20. The test apparatus of claim 18, wherein the magnetic field generator generates directional magnetic field pulses as the first and second magnetic fields, and a magnitude of the second magnet field is less than a magnitude of the first magnetic field.

* * * * *